US009098252B2

(12) United States Patent
Sauer et al.

(10) Patent No.: US 9,098,252 B2
(45) Date of Patent: Aug. 4, 2015

(54) PERIPHERAL COMPONENT INTERCONNECT RISER CAGE FASTENER

(75) Inventors: Keith A Sauer, Spring, TX (US); Kelly K Smith, Spring, TX (US); David M Paquin, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 158 days.

(21) Appl. No.: 13/529,257

(22) Filed: Jun. 21, 2012

(65) Prior Publication Data

US 2013/0343830 A1 Dec. 26, 2013

(51) Int. Cl.
*F16B 21/04* (2006.01)
*G06F 1/18* (2006.01)
*H05K 7/14* (2006.01)

(52) U.S. Cl.
CPC .............. *G06F 1/186* (2013.01); *H05K 7/1429* (2013.01); *F16B 21/04* (2013.01); *Y10T 29/49947* (2013.01)

(58) Field of Classification Search
USPC .................. 411/339, 549, 559, 552–555, 409
See application file for complete search history.

(56) References Cited

U.S. PATENT DOCUMENTS

| | | | | |
|---|---|---|---|---|
| 2,380,240 | A * | 7/1945 | Hufferd | 411/105 |
| 2,798,404 | A * | 7/1957 | Schaefer et al. | 411/409 |
| 3,568,263 | A | 3/1971 | Clarence et al. | |
| 3,585,824 | A * | 6/1971 | Schenk | 70/48 |
| 3,594,876 | A * | 7/1971 | Gunther | 411/555 |
| 3,958,308 | A * | 5/1976 | Gooding | 411/554 |
| 5,275,029 | A * | 1/1994 | Myers | 70/128 |
| 5,570,984 | A * | 11/1996 | Reznikov et al. | 411/551 |
| 5,754,412 | A | 5/1998 | Clavin | |
| 5,975,822 | A * | 11/1999 | Ruff | 411/553 |
| 6,261,042 | B1 | 7/2001 | Pratt | |
| 6,549,424 | B1 | 4/2003 | Beseth et al. | |
| 6,679,646 | B2 * | 1/2004 | Quardt et al. | 403/348 |
| 7,614,903 | B1 | 11/2009 | Huang | |
| 7,828,592 | B2 | 11/2010 | Tobey et al. | |
| 8,066,461 | B2 | 11/2011 | Travers | |
| 2003/0156923 | A1 * | 8/2003 | Winkler et al. | 411/552 |

FOREIGN PATENT DOCUMENTS

| | | |
|---|---|---|
| GB | 1508832 | 4/1978 |
| WO | WO-2008009065 | 1/2008 |

* cited by examiner

*Primary Examiner* — Flemming Saether
(74) *Attorney, Agent, or Firm* — Hewlett-Packard Patent Department

(57) ABSTRACT

A fastener useable with a peripheral component interconnect riser cage is provided herein. The fastener includes a body, a rotation limiter, and a housing. The body includes an engagement end that engages with a receptacle on a sub-pan and a cap end that positions the body. The rotation limiter includes a receiving member and a positioning member. The receiving member couples with the body. The positioning member extends from the rotation limiter to limit rotation of the body coupled thereto. The housing receives the rotation limiter and the body. The housing includes a rotation aperture that receives a positioning member such that the rotation limiter is rotatable along the rotation aperture. The housing further includes a lateral aperture to receive the body such that the body is inserted through the lateral aperture and coupled to the rotation limiter.

20 Claims, 11 Drawing Sheets

PERIPHERAL COMPONENT INTERCONNECT RISER CAGE FASTENER

BACKGROUND

A peripheral component interconnect (PCI) riser cage holds PCI cards, such as graphics, audio, and storage cards. The PCI riser cage is connected to a server chassis. The PCI riser cage is secured to the server chassis using fasteners.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

A peripheral component interconnect (PCI) riser cage is secured to the server chassis using fasteners. The fasteners typically include a fastener head that requires a tool to access and tighten the fastener. Oftentimes, use of tools to tighten the fastener is difficult, since the space to access the fastener is limited. Moreover, the use of additional tools takes additional time and may even require a user to read instructions and position the tool in a specific position thereon.

In examples, a fastener useable with a peripheral component interconnect (PCI) riser cage is provided. The fastener includes a body, a rotation limiter, and a housing. The body includes an engagement end that engages with a receptacle on a sub-pan and a cap end that positions the body. The rotation limiter includes a receiving member and a positioning member. The receiving member couples with the body. The positioning member extends from the rotation limiter to limit rotation of the body coupled thereto. The housing receives the rotation limiter and the body. The housing includes a rotation aperture that receives a positioning member such that the rotation limiter is rotatable along the rotation aperture. The housing further includes a lateral aperture to receive the body such that the body is inserted through the lateral aperture and coupled to the rotation limiter. The fastener provided herein secures the PCI riser cage by limiting rotation of the fastener and does not require the use of tools.

Figure 1:
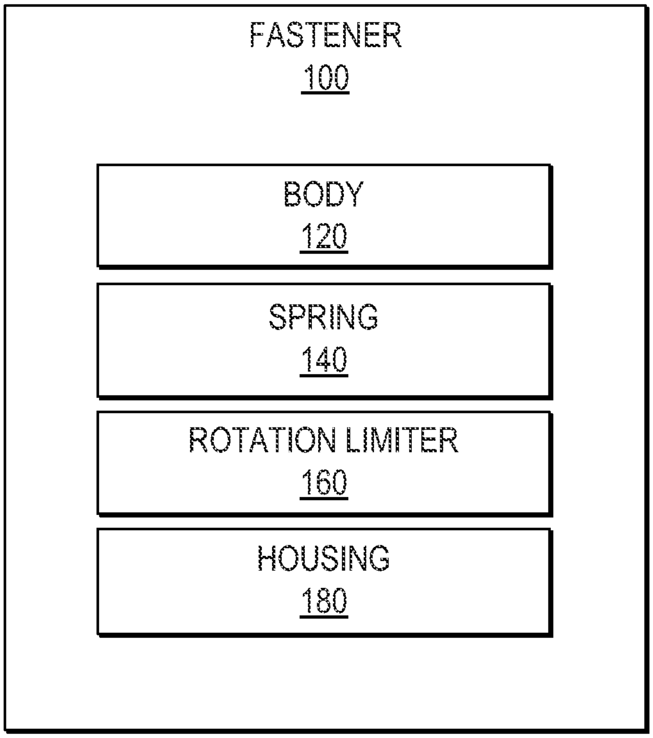
FIG. 1 illustrates a block diagram of a fastener useable with a PCI riser cage according to an example.

FIG. 1 illustrates a block diagram of a fastener 100 useable with a peripheral component interconnect (PCI) riser cage according to an example. The fastener 100 includes a body 120, a spring 140, a rotation limiter 160, and a housing 180. The body 120 includes an engagement end and a cap end. The engagement end engages with a receptacle on a sub-pan. The cap end positions the body 120. The spring 140 is connected to the body 120 between the engagement end and the cap end and positions the body 120.

The rotation limiter 160 includes a receiving member and a positioning member. The receiving member couples with the body 120. Once coupled, the body 120 and the rotation limiter 160 move together as a unitary member. The positioning member extends from the receiving member and is received by the housing 180 to limit rotation of the body 120 coupled thereto.

The housing 180 receives the rotation limiter 160 and the body 120. The housing 180 includes a rotation aperture and a lateral aperture. The rotation aperture extends longitudinally therein and receives the positioning member such that the rotation limiter 160 is rotatable along the rotation aperture. The lateral aperture extends laterally therethrough and receives the body 120 such that the body 120 is inserted through the lateral aperture and coupled to the receiving member of the rotation limiter 160.

Figure 2:
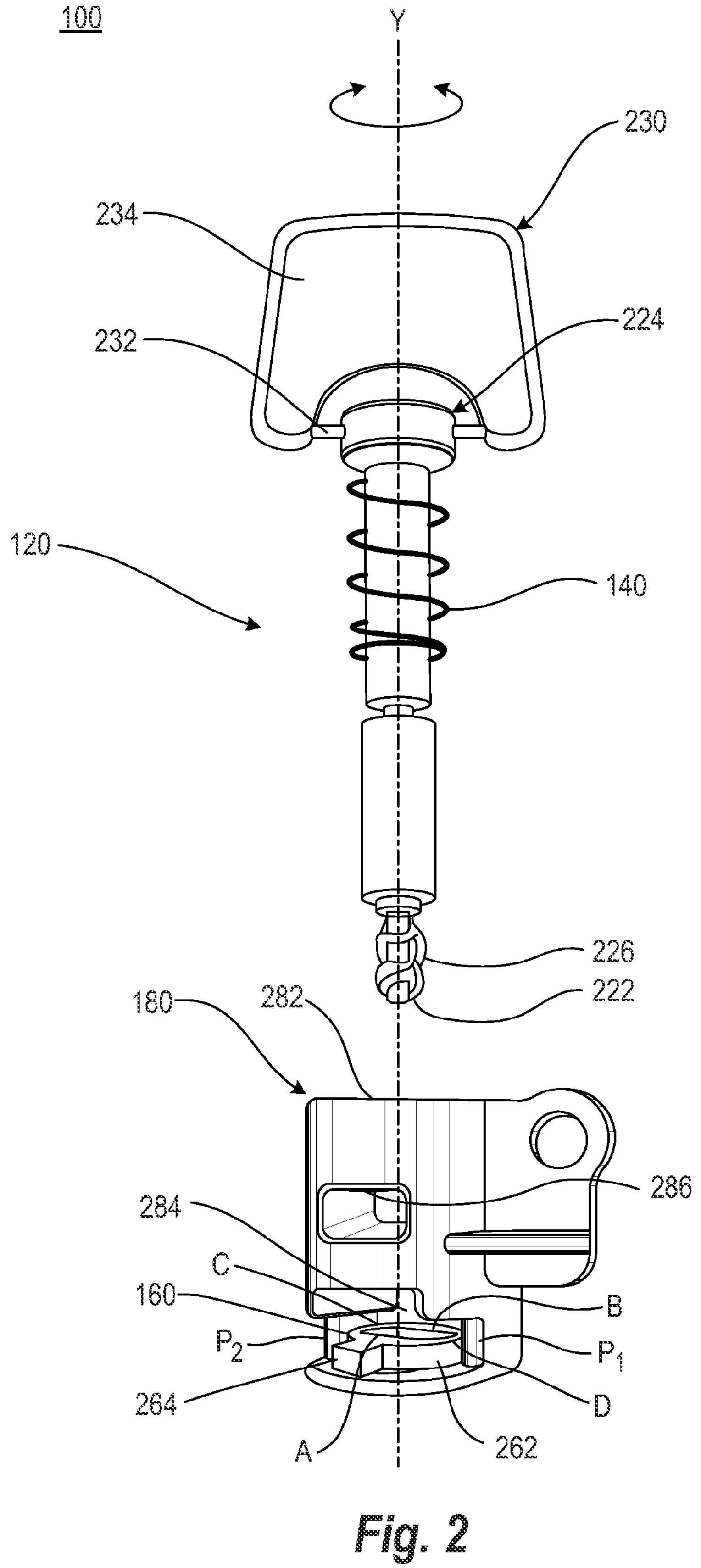
FIG. 2 illustrates the fastener of FIG. 1 according to an example.

FIG. 2 illustrates the fastener 100 of FIG. 1 according to an example. The fastener 100 as illustrated includes the body 120, a spring 140, a rotation limiter 160, and a housing 180. The body 120 extends through a system board and connects to a receptacle on a sub-pan. The body 120 includes an engagement end 222 and a cap end 224. The engagement end 222 engages with the receptacle on a sub-pan. The engagement end 222 comprises a threaded member 226 that engages with the receptacle.

The cap end 224 positions the body 120 using, for example, a cap 230 attached thereto. For example, the cap 230 includes a wire 232 extending from the cap end 224 and a tab 234 attached to the wire 232. The tab 234 rotates around the wire 232. The rotation of the tab 234 is illustrated as movement around an X axis between an active and an inactive state. In the active state, the tab 234 extends longitudinally from the body 120 and is utilized to rotate the body 120 and fasten to a PCI riser card to a system board. In the inactive state, the tab 234 is rotated to extend laterally from the body 120. For example, the tab 234 may extend perpendicular from the body 120 and lie flush with the cap end 224 of the body 120 to avoid interfering with the assembly.

The spring 140 connects to the body 120 between the engagement end 222 and the cap end 224. The spring 140 positions the body 120 longitudinally therein. The spring 140 is moveable between a compressed position and expanded position, as illustrated in FIGS. 6A-6D below.

The rotation limiter 160 is received by the housing 180 and limits the rotation of the fastener 100 between a first point, P1, and a second point, P2, on the housing 180. The first point, P1, and the second point, P2, are, for example, one hundred and eighty degrees apart. The rotation limiter 160 includes a receiving member 262 and a positioning member 264. The receiving member 262 couples with the body 120 and holds the body 120 and the rotation limiter 160 together. Once coupled, the body 120 and the rotation limiter 160 move together as a unitary member. For example, the rotation limiter 160 is illustrated with the receiving member 262 having a double D shape, i.e., two straight edges illustrated as edges A-B and two rounded edges illustrated as edges C-D, that receive and engage with the body 120. The double D shape enables rotation of the body 120 and the rotation limiter 160 as a single or unitary member. The positioning member 264 extends from the rotation limiter 160 and limits rotation of the body 120 coupled thereto.

The housing 180 receives the rotation limiter 160 and the body 120. The housing 180 includes a rotation aperture 284 and a lateral aperture 282. The rotation aperture 284 extends longitudinally therein and receives the rotation limiter 160 such that the positioning member 264 is rotatable along the rotation aperture 284. The lateral aperture 282 extends laterally therethrough and receives the body 120 such that the body 120 is insertable through the lateral aperture 282 and couples to the receiving member 262 of the rotation limiter 160. After the body 120 is inserted into the housing 180 and through the rotation limiter 160, the engagement of the body 120 and the receiving member 262 and the positioning member 264 and the rotation aperture limits rotation of the rotation limiter 160 and the body 120 thereabout.

The housing 180 may further include a biasing member 286 that engages with the spring 140 and positions the body 120. For example, the biasing member 286 may be a lip or ledge in the housing 180 that causes the spring 140 to compress as the body 120 is rotated and engages with the receptacle. For example, the receptacle includes a receiving aperture with an engagement member extending therefrom. The engagement between the body 120 and the engagement member secures the fastener 100 therein.

Figure 3:
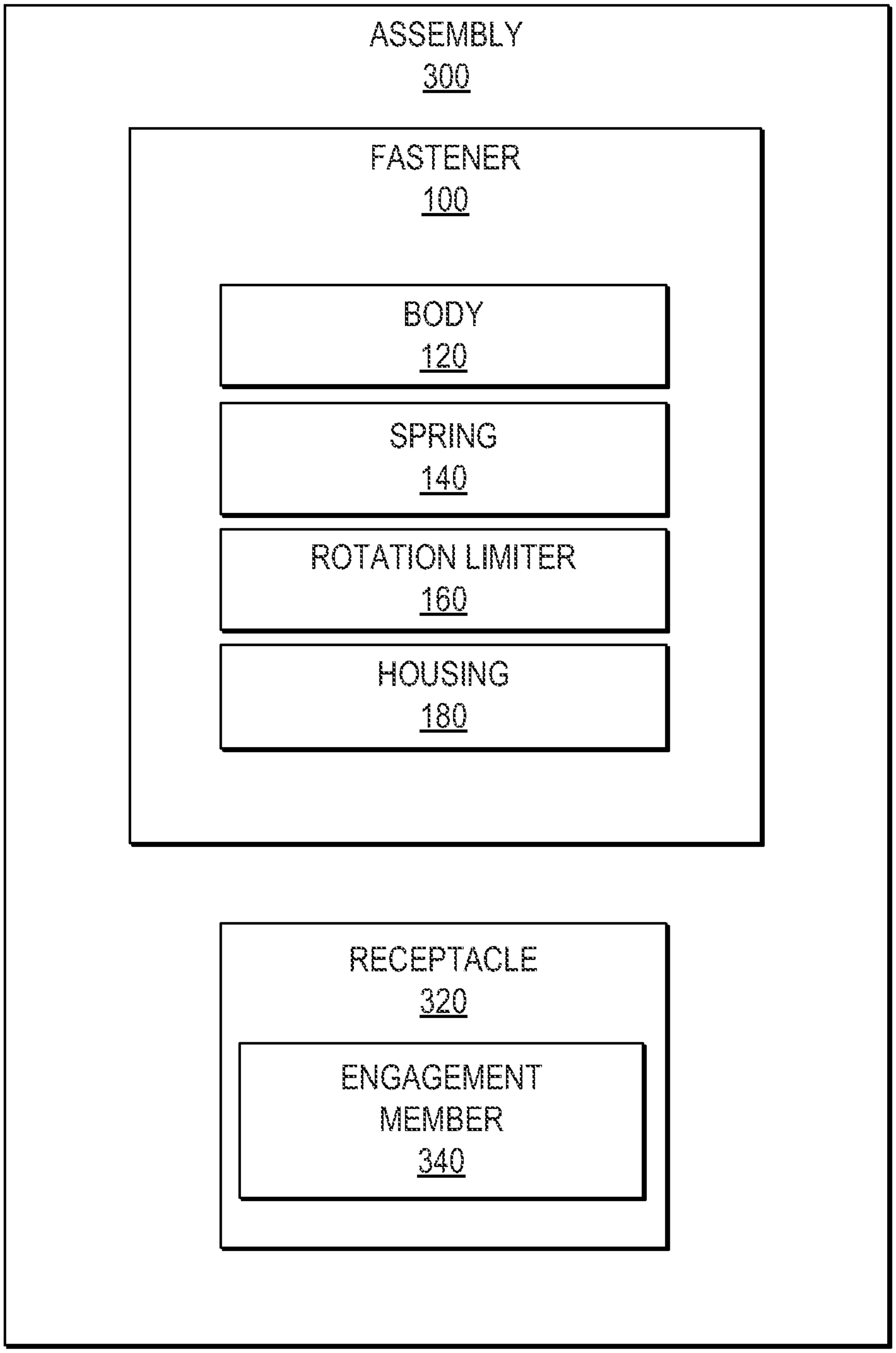
FIG. 3 illustrates a block diagram of an assembly useable with a PCI riser cage according to an example.

FIG. 3 illustrates a block diagram of an assembly 300 useable with a PCI riser cage according to an example. The assembly 300 includes a fastener 100 and a receptacle 320. The fastener 100 includes a body 120, a spring 140, a rotation limiter 160, and a housing 180. The body 120 includes an engagement end 222 and a cap end 224. The engagement end 222 engages with a receptacle 320 on a sub-pan. The cap end 224 positions the body 120. The spring 140 connects to the body 120 between the engagement end 222 and the cap end 224 and positions the body 120 longitudinally therein.

The rotation limiter 160 includes a receiving member 262 and a positioning member 264. The receiving member 262 couples with the body 120 and holds the body 120. Once coupled, the body 120 and the rotation limiter 160 move together as a unitary member. The positioning member 264 extends from the rotation limiter 160 and is received by the housing 180, which limits rotation of the body 120 coupled thereto.

The housing 180 receives the rotation limiter 160 and the body 120. The housing 180 includes a rotation aperture 284 and a lateral aperture 282. The rotation aperture 284 extends longitudinally therein and receives the rotation limiter 160 such that the positioning member 264 is rotatable along the rotation aperture 284. For example, the rotation limiter 160 slides into the rotation aperture 284 with the positioning member 264 extending into or along the rotation aperture 284. The lateral aperture 282 extends laterally therethrough and receives the body 120 such that the body 120 is insertable through the lateral aperture 282 and couples to the receiving member 262 of the rotation limiter 160. The body 120 holds the rotation limiter 16 therein.

The receptacle 320 receives the fastener 100. The receptacle 320 includes an engagement member 340 that engages with the engagement end 222 of the body 120 and secures the body 120 thereto.

Figure 4:
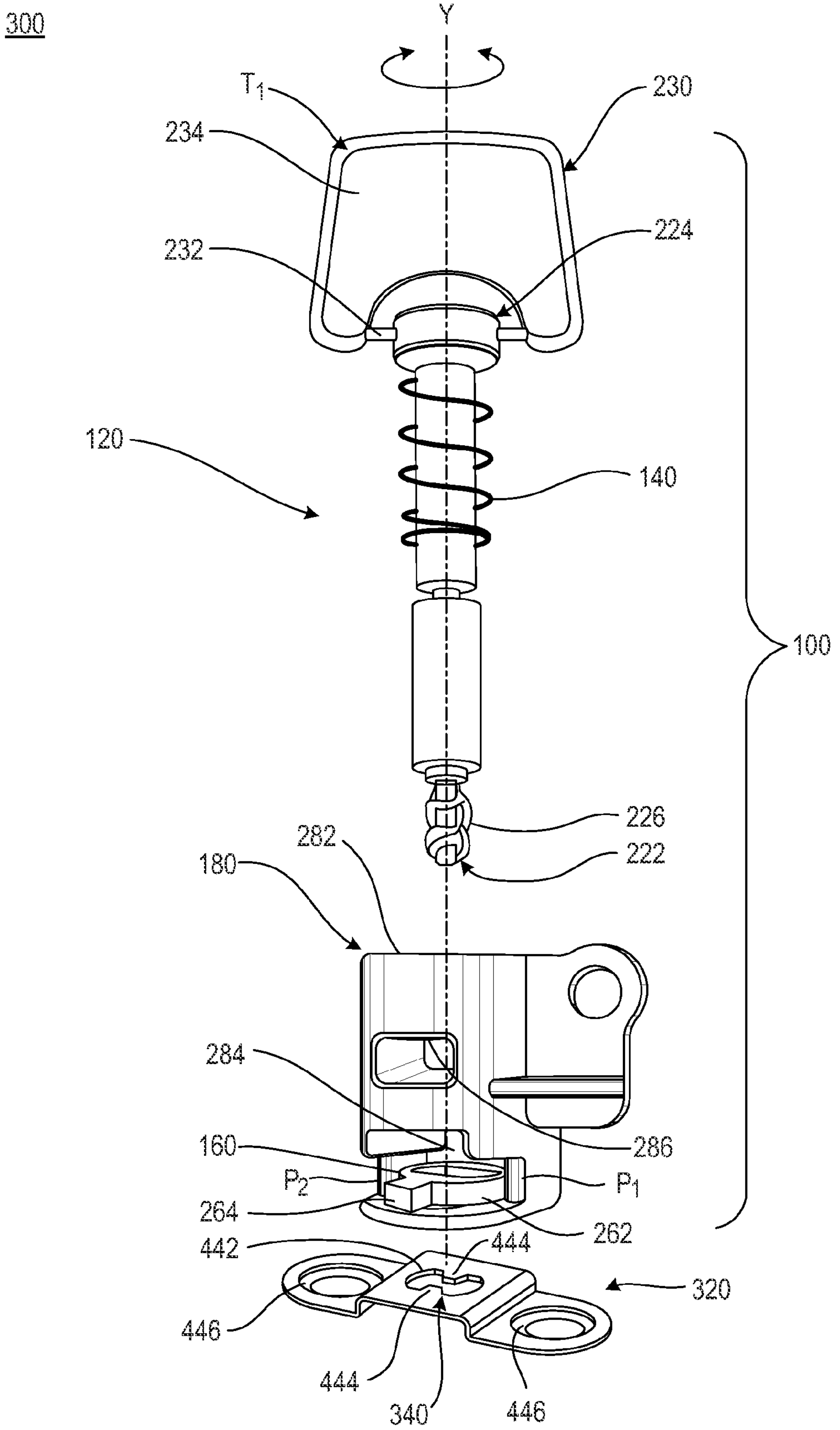
FIGS. 4, 4A and 5 illustrate the assembly of FIG. 3 according to examples.
Figure 5:
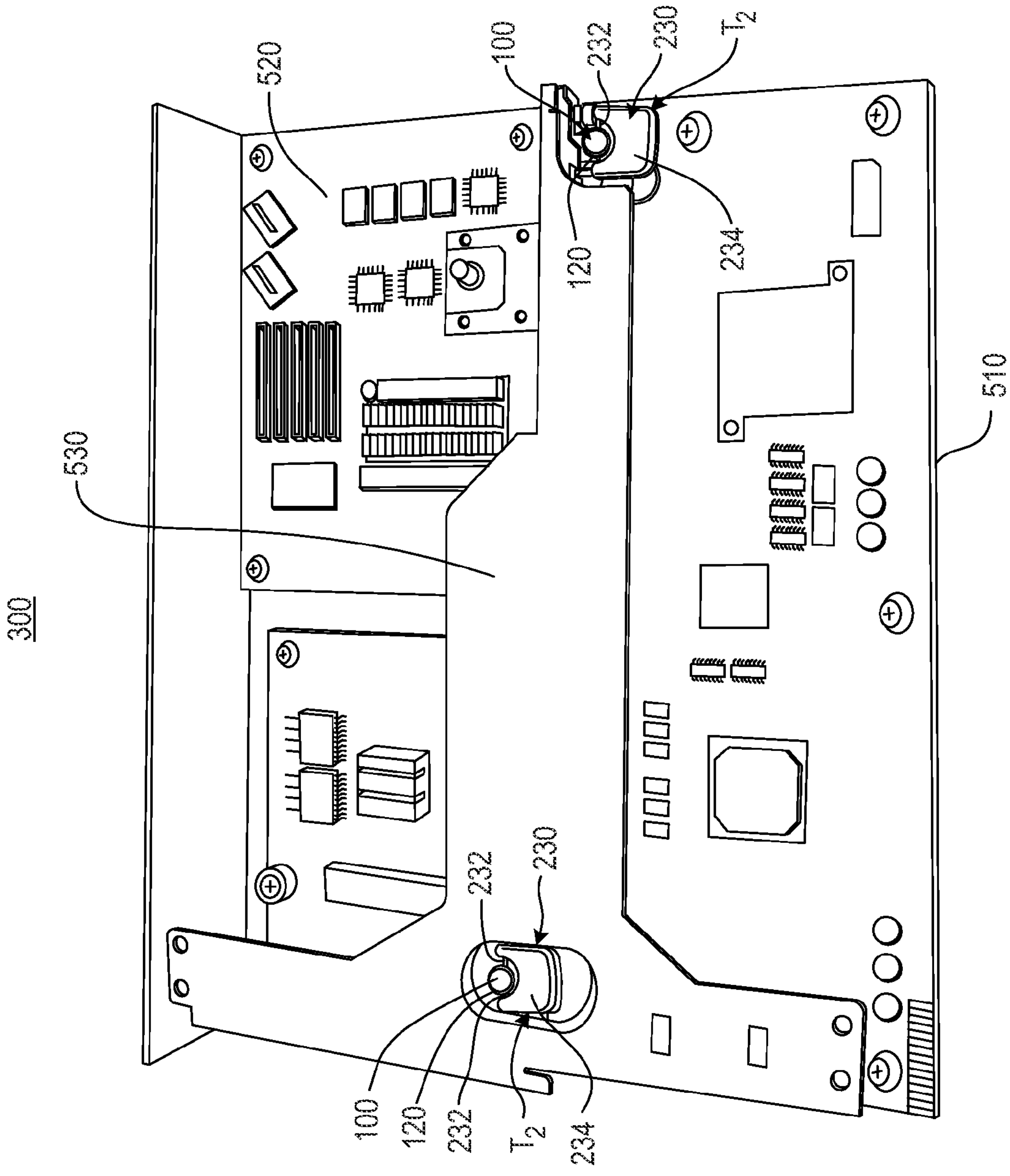

FIGS. 4-6 illustrate the assembly of FIG. 3 according to examples. The assembly includes a fastener 100 and a receptacle 320.

The fastener 100 includes body 120, a spring 140, a rotation limiter 160, and a housing 180. The body 120 includes an engagement end 222 and a cap end 224. The engagement end 222 engages with a receptacle 320 on a sub-pan. For example, the engagement end 222 includes a threaded member 226 that engages with the engagement member 340 of the receptacle 320. The cap end 224 positions the body 120 using, for example, a cap 230 attached to the cap end 224 of the body 120. For example, the cap 230 includes a wire 232 extending from the cap end 224 and a tab 234 attached to the wire 232. The tab 234 rotates around the wire 232. The rotation of the tab 234 is illustrated as movement around an X axis between an active state, T1, and an inactive state, T2. For example, FIG. 4 illustrates the tab 234 in the active state, T1, and FIG. 5 illustrates the tab 234 in the inactive state, T2. Referring to FIG. 4, in the active state, T1, the tab 234 extends longitudinally from the body 120 and is utilized to rotate the body 120 and fasten a PCI riser card to a system board. Referring to FIG. 5, in the inactive state, T2, the tab 234 is rotated to extend laterally from the body 120. For example, the tab 234 may lie flush with the cap end 224 of the body 120 to avoid interfering with the assembly.

The spring 140 connects to the body 120 between the engagement end 222 and the cap end 224 and positions the body 120 longitudinally therein. The spring 140 is moveable between a compressed position and expanded position, as illustrated in FIGS. 6A-6D below.

The rotation limiter 160 is received by the housing 180, which limits the rotation of the fastener 100 on the housing 180. For example, the rotation may be limited between a first point, P1, and a second point, P2, that are one hundred and eighty degrees apart. The rotation limiter 160 includes a receiving member 262 and a positioning member 264. The receiving member 262 couples with the body 120 and holds the body 120 and the rotation limiter 160 together. Once coupled, the body 120 and the rotation limiter 160 move together as a unitary member. For example, the rotation limiter 160 is illustrated with the receiving member 262 having a double D shape to engage with the body 120. The double D shape enables rotation of the body 120 and the rotation limiter 160 as a single or unitary member. The positioning member 264 extends from the rotation limiter 160 to limit rotation of the body 120 coupled thereto.

Figure 4A:
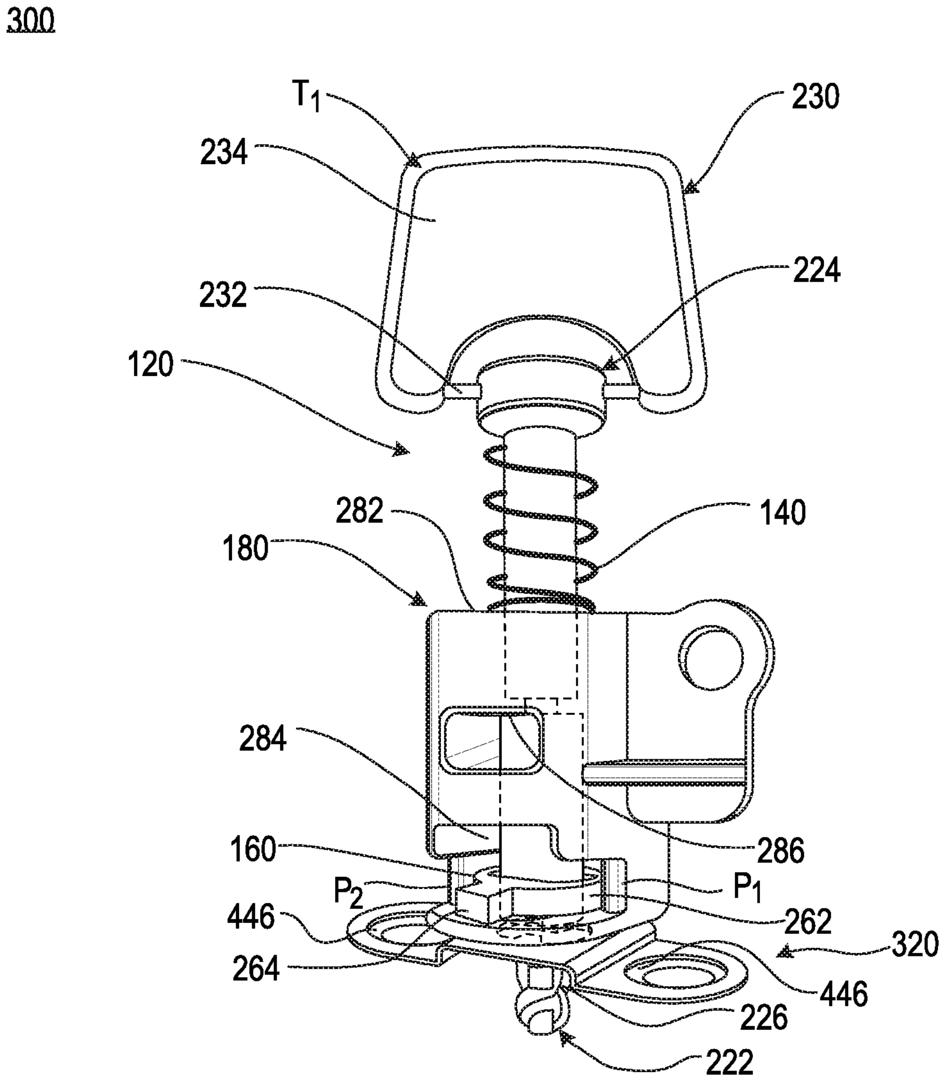

As shown by FIG. 4A, the housing 180 receives the rotation limiter 160 and the body 120. The housing 180 includes a rotation aperture 284 and a lateral aperture 282. The rotation aperture 284 extends longitudinally therein and receives the rotation limiter 160 such that the positioning member 264 is rotatable along the rotation aperture 284. The lateral aperture 282 extends laterally therethrough and receives the body 120 such that the body 120 is inserted through the lateral aperture 282 and coupled to the receiving member 262 of the rotation limiter 160. After the body 120 is inserted into the housing 180 and through the rotation limiter 160, the engagement of the body 120 and the receiving member 262 and the positioning member 264 and the rotation aperture 284 limits rotation of the rotation limiter 160 and the body 120 thereabout.

The housing 180 further includes a biasing member 286 to engage with the spring 140 and position the body 120. For example, the biasing member 286 may be a lip or ledge in the housing 180 that causes the spring 140 to compress as the body 120 rotates and engages with the receptacle. The engagement between the body 120 and the engagement member 340 secures the fastener 100 thereto.

The receptacle 320 receives the fastener 100. The receptacle 320 includes an engagement member 340 that engages with the engagement end 222 of the body 120. For example, the receptacle 320 includes a receiving aperture 442 with a protrusion 444 extending therefrom that forms the engagement member 340. The engagement member 340 may further include a plurality of convex protrusions 444, illustrated as a pair of convex protrusions extending from the receiving aperture 422 to engage with and secure the engagement end 222 of the body 120 thereto. The receptacle 320, as illustrated in FIG. 4, is attached to the sub-pan that receives a system board, using for example, a pair of connection members 446.

Referring to FIG. 5, the assembly 300 is illustrated attached to a sub-pan 510 with a system board 520 and a PCI riser cage 530 thereon. FIGS. 6A-6D illustrate further details of the assembly 300 useable with the system board 520 and PCI riser cage 530 of FIG. 5. FIGS. 5 and 6A-6D illustrate the system board 520 including a board aperture 620 for the body 120 to extend through and connect to the receptacle 320 on the sub-pan 510. The PCI riser cage 530 attaches to the system board 520 on the sub-pan 510.

Referring to FIG. 5, the assembly 300 includes two fasteners 100 attaching the PCI riser cage 530 to the sub-pan 410 with the system board 520 attached. The fasteners 100 are illustrated with the tabs 234 in the inactive state, T2, with the tabs 234 approximately level or flush with the PCI riser cage 530 and the cap end 224 of the body 120. In this position, the tabs 234 do not interfere with the functioning or positioning of the PCI riser cage 530 or system board 520.

Referring to FIGS. 6A-6D an example of the operation of the fastener 100 at various positions is illustrated. The fastener 100 is illustrated to include the body 120 with a cap 230 attached to the body 120. The cap 230 is attached such that the cap 230 is useable by a user to rotate the body 120 around the Y axis. The cap 230 as illustrated includes a wire 232 extending from the cap end 224 of the body 120 and a tab 234 attached thereto such that the tab 234 is movable around the wire 232. The wire 232 is illustrated to lie along the X axis.

Figure 6A:
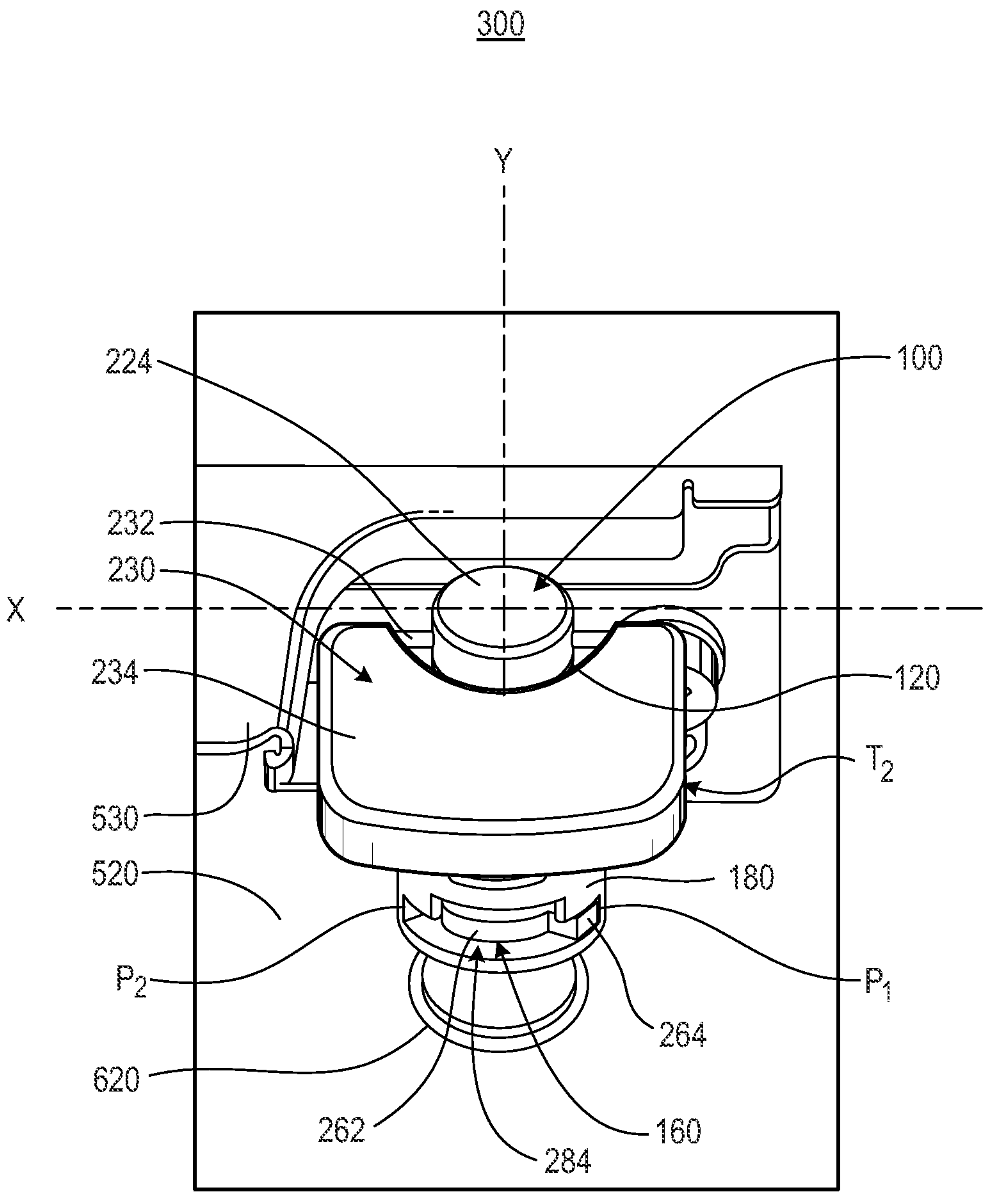
FIGS. 6A-6D illustrate an example of the operation of the fastener of FIG. 3 at various positions.
Figure 6B:
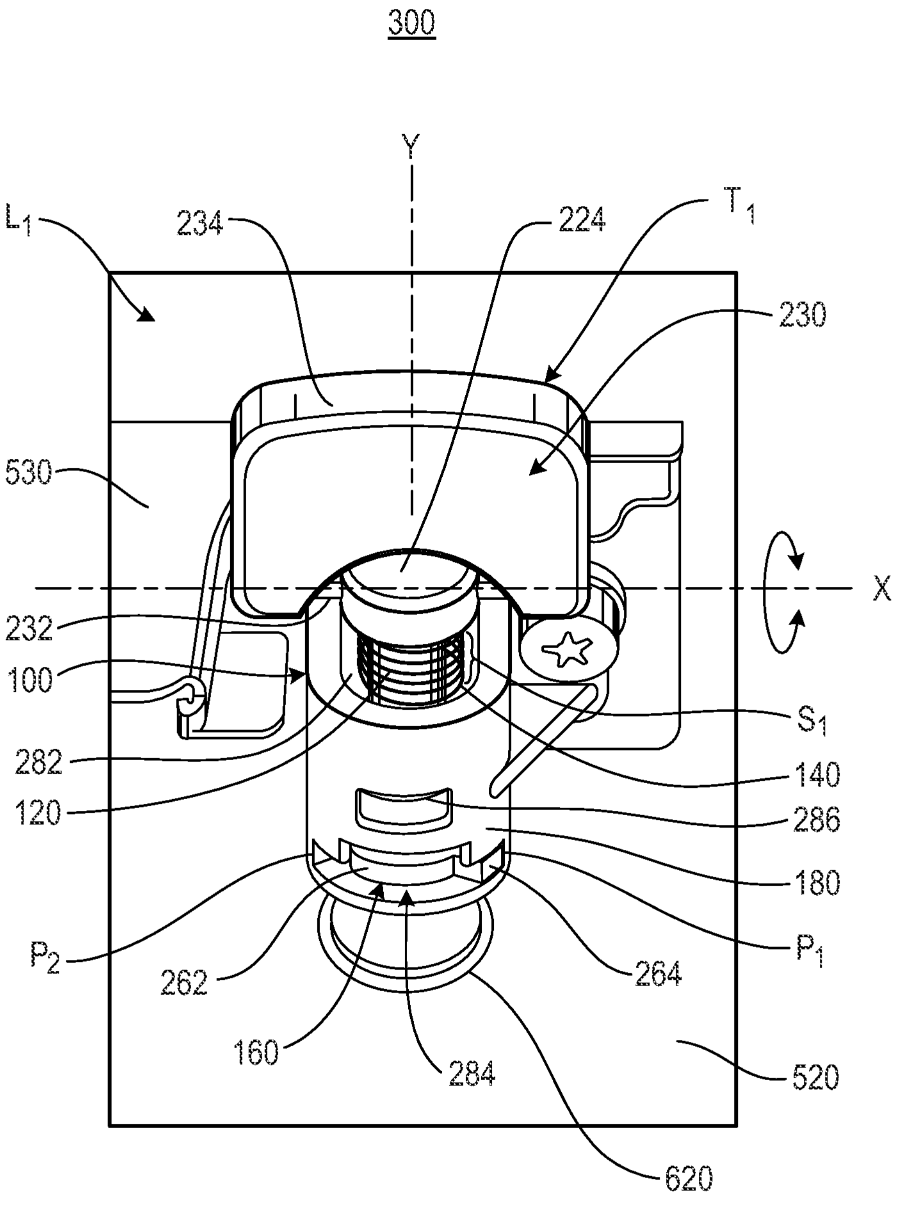

FIG. 6A illustrates the tab 234 in the plane of the X axis and lies approximately level or flush to the PCI riser cage 530 in, for example, an inactive state, T2. In FIG. 6B, the tab 234 is rotated around the wire 232 along the X axis and is positioned in the plane of the Y axis in, for example, an active state, T1.

Referring to FIGS. 6A-6B, the spring 140 is compressed S1 and the positioning member 282 is at a first point, P1. The spring 140 remains compressed S1 as the threaded member 226 of the body 120 remains engaged with the receptacle 320. When the spring 140 is compressed S1, the spring 140 is held on the body 120 by the cap end 224 and the biasing member 286 in the housing 180 that applies the pressure that holds the spring 140 in the compressed S1 state.

Rotation of the body 120 between the positions illustrated in FIGS. 6A-6D, moves the fastener 100 between a locked state, L1, and an unlocked state, L2. In the locked state, L1, illustrated in FIGS. 6A-6B, the engagement end 222 engages with the engagement member 340 of the receptacle 320 and compresses S1 the spring 140 such that the PCI riser cage 530 is secured to the sub-pan 510. In the unlocked state, L2, illustrated in FIG. 6D, the spring 140 expands S2 and the engagement end 222 releases from engagement with the engagement member 340 of the receptacle 320. The fastener 100 may similarly move from the unlocked state, L2, to the locked state, L1, by moving in reverse order from FIG. 6D through 6A.

Figure 6C:
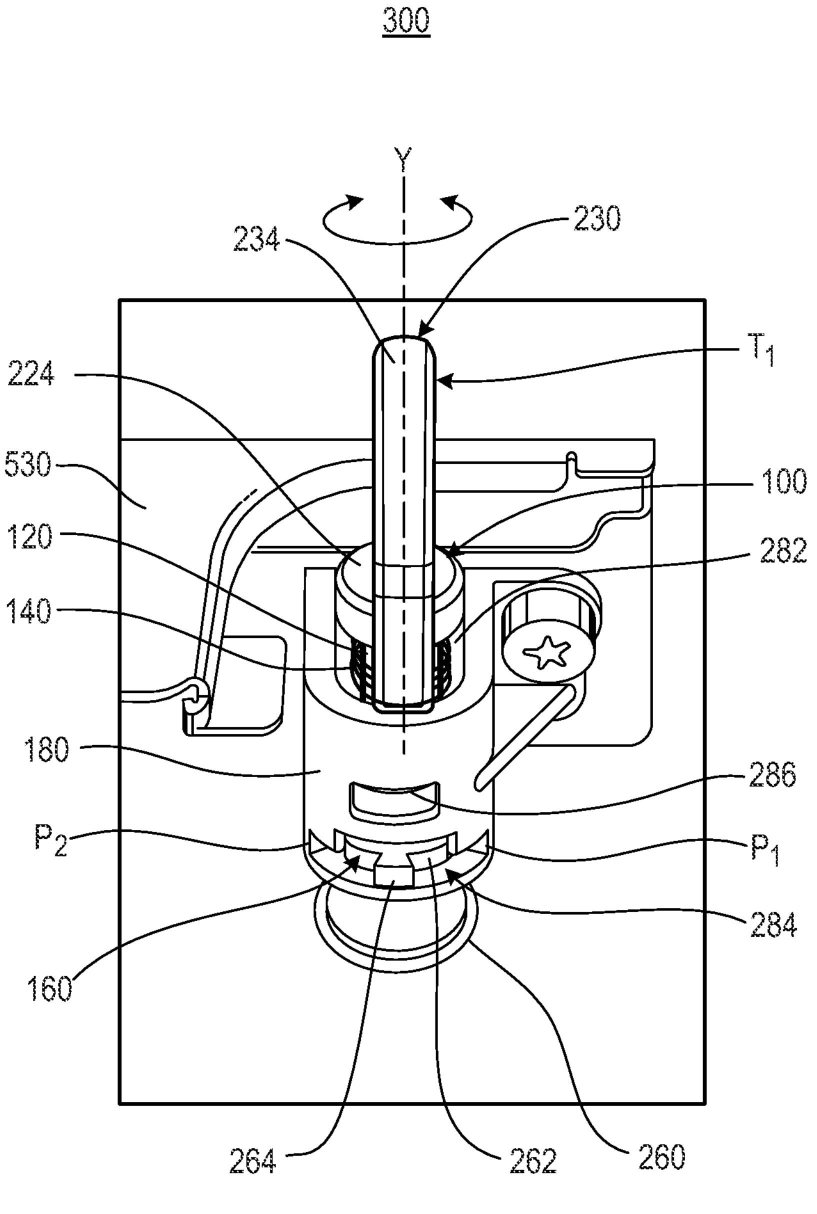
Figure 6D:
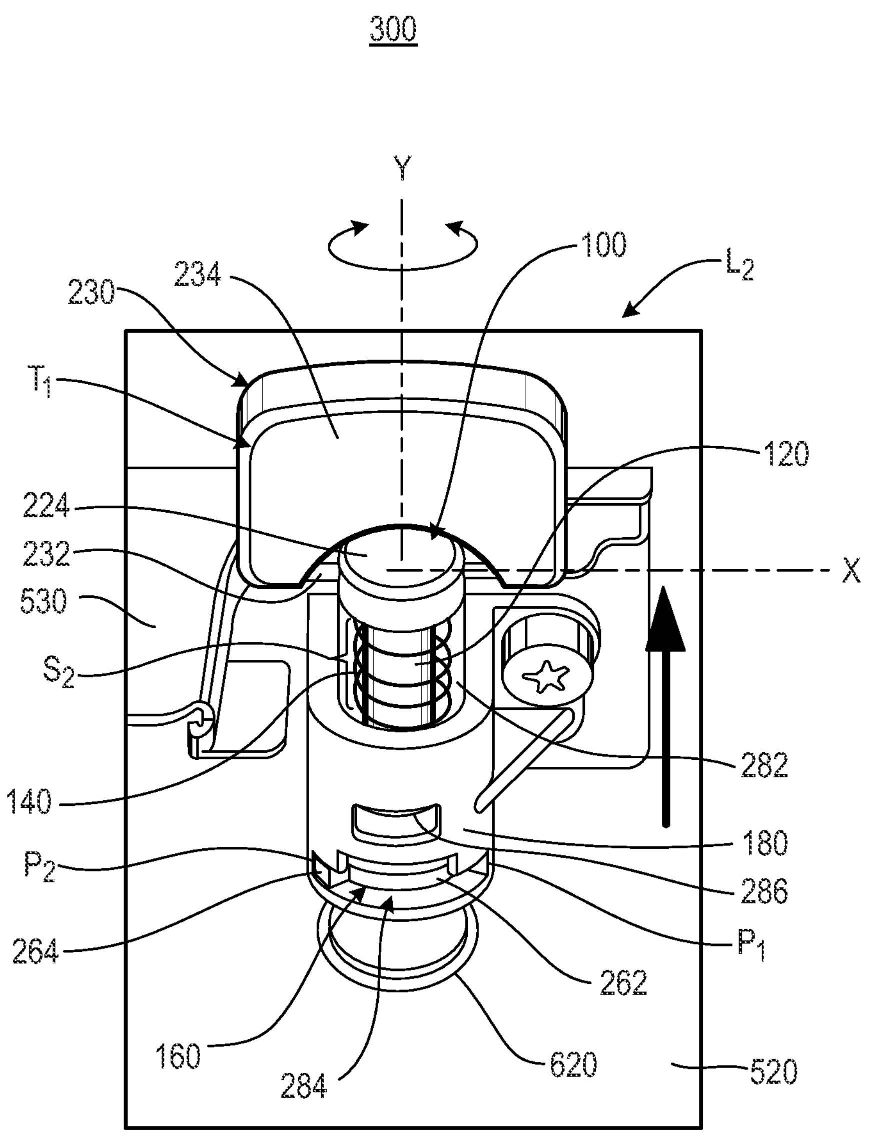

For example, the body 120 is rotated one hundred and eighty degrees between FIGS. 6B-6D using the tab 234 to rotate the body 120 coupled to the rotation limiter 160. In FIG. 6B, the fastener 100 begins at the first point, P1, with the body 120 rotated zero degrees. FIG. 6C illustrates the fastener 100 rotated ninety degrees, and FIG. 6D illustrates the fastener rotated another ninety degrees, such that the positioning member 282 reaches the second point, P2. The rotation of the body 120 one hundred eighty degrees, between points P1 and P2, releases the threaded member 226 from the receptacle 320. As the threaded member 226 releases from the receptacle 320, the spring 140 expands S2. The expansion of the spring 140 causes the threaded member 226 of the engagement end 222 of the body 120 to come out of connection with or release from the receptacle 320. Moreover, the spring 140 expands S2 since the cap end 224 and the biasing member 286 are not applying pressure to keep the spring 140 compressed S1.

Figure 7:
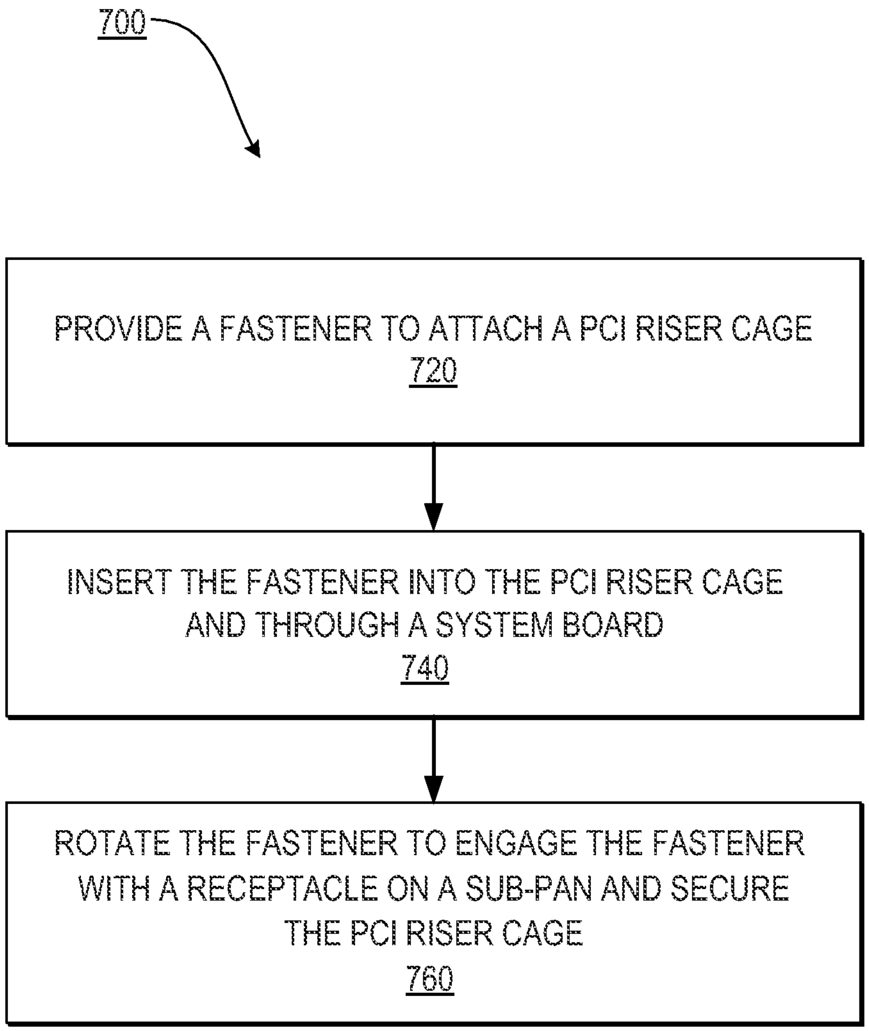
FIG. 7 illustrates a flow chart of a method to secure a PCI riser cage according to an example.

FIG. 7 illustrates a flow chart 700 of a method to secure a PCI riser cage according to an example. In block 720, the method provides the fastener to attach the PCI riser cage to a sub-pan. The fastener includes a body, a rotation limiter, and a housing. The body includes an engagement end that engages with a receptacle on a sub-pan and a cap end to position the body. The rotation limiter includes a receiving member that couples with the body and a positioning member extending from the rotation limiter to limit rotation of the body coupled thereto. The housing receives the rotation limiter and the body. The housing includes a rotation aperture and a lateral aperture. The rotation aperture extends longitudinally therein and receives the positioning member such that the rotation limiter is rotatable along the rotation aperture. The lateral aperture extends laterally therethrough and receives the body such that the body is inserted through the lateral aperture and coupled to the receiving member of the rotation limiter.

The fastener is inserted into the PCI riser cage and through a system board, in block 740. The PCI riser cage and the system board each include at least one aperture aligned to receive the fastener. In block 760, the fastener is rotated and engages the fastener with a receptacle on a sub-pan and secures the PCI riser cage thereon. Rotation of the fastener includes, for example, limiting rotation of the fastener, such as limiting rotation to at most one hundred eighty degrees between a first point and second point. The rotation may be performed by a user and aided through the use of a cap that rotates the body, and engages the engagement end of the fastener with an engagement member on the receptacle. The cap may include, for example, a tab and a wire that enables the tab to move between an active and an inactive state, such that the tab lies approximately level or flush with the PCI riser cage when the tab is not in use. The tab is also rotatable such that the tab extends from the body of the fastener and is useable to rotate the fastener around the Y axis, as illustrated in FIGS. 2, 4, and 6A-6D above.

The receptacle includes an engagement member that the engagement end engages with. The engagement member may include a receiving aperture with a plurality of convex protrusions that engage with the engagement end of the fastener. As the engagement end engages with the receptacle, a spring on the body may be compressed by a biasing member in the housing to hold the PCI riser cage and reduce movement of the PCI riser cage fastened thereto. Similarly, as the engagement end releases from the receptacle, the spring expands and moves the threaded member out of engagement with the engagement member.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms “comprise,” “include,” “have” and their conjugates, shall mean, when used in the present disclosure and/or claims, “including but not necessarily limited to.”

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A fastener useable with a peripheral component interconnect (PCI) riser cage, the fastener comprising:

a body with an engagement end and a cap end, the engagement end to engage with a receptacle on a sub-pan, the cap end to position the body;

a spring connected to the body between the engagement end and the cap end to position the body;

a rotation limiter including a receiving member with a double D shape to couple with the body, such that the body and the rotation limiter move together as a unitary member, and a positioning member extending from the rotation limiter to limit rotation of the body coupled thereto; and a housing to receive the rotation limiter and the body, the housing includes a rotation aperture and a lateral aperture, the rotation aperture extending longitudinally therein to receive the positioning member such that the rotation limiter is rotatable along the rotation aperture, the lateral aperture extending laterally therethrough to receive the body such that the body is inserted through the lateral aperture, positioned by the spring, and coupled to the receiving member of the rotation limiter.

2. The fastener of claim 1, wherein the body extends through a system board and connects to a receptacle on a sub-pan.

3. The fastener of claim 2, wherein the engagement end comprises a threaded member to engage with the receptacle.

4. The fastener of claim 1, further comprising a cap attached to the cap end of the body to position the body.

5. The fastener of claim 4, wherein the cap comprises a wire extending from the cap end of the body and a tab attached thereto.

6. The fastener of claim 1, wherein the rotation limiter enables rotation of the fastener between a first point and a second point.

7. The fastener of claim 6, wherein the first point and the second point are one hundred and eighty degrees apart.

8. The fastener of claim 1, wherein the housing further comprises a biasing member, the biasing member includes a lip in the housing that causes the spring to compress as the body is rotated and engages with the receptacle.

9. An assembly usable with a peripheral component interconnect (PCI) riser cage, the assembly comprising:

a fastener including:

a body with an engagement end and a cap end, the engagement end to engage with a receptacle on a sub-pan, the cap end to position the body, a spring connected to the body between the engagement end and the cap end to position the body, a rotation limiter including a receiving member with a double D shape to couple with a portion of the body to hold the body and the rotation limiter together, and a positioning member to couple with the engagement end of the body, the positioning member extending from the rotation limiter to limit rotation of the body coupled thereto; and a housing includes a rotation aperture and a lateral aperture that receives the rotation limiter and the body, the rotation aperture extending longitudinally therein to receive the positioning member such that the rotation limiter is rotatable along the rotation aperture, the lateral aperture extending laterally therethrough to receive the body such that the body is inserted through the lateral aperture, positioned using the spring, and coupled to the receiving member of the rotation limiter; and a receptacle to receive the fastener, the receptacle including an engagement member to engage with the engagement end of the body.

10. The assembly of claim 9, wherein the receptacle comprises a receiving aperture with the engagement member extending therefrom to engage with and secure the engagement end of the body thereto.

11. The assembly of claim 10, wherein the engagement end comprises a threaded member to engage with the engagement member of the receptacle.

12. The assembly of claim 9, wherein the receptacle is attached to the sub-pan.

13. The assembly of claim 9, wherein the PCI riser cage attaches to a system board on the sub-pan.

14. The assembly of claim 9, further comprising a system board, the system board including a board aperture for the body to extend through and connect to the receptacle.

15. The assembly of claim 9, further comprising a cap attached to the body to enable rotation of the body.

16. The assembly of claim 9, wherein the housing further comprises a biasing member to engage with the spring and position the body.

17. The assembly of claim 9, wherein the rotation limiter and the housing permit rotation of the body one hundred and eighty degrees.

18. The assembly of claim 9, wherein rotation of the body moves the fastener between a locked state and an unlocked state, in the locked state the engagement end engages with the engagement member and compresses the spring such that the PCI riser cage is secured to the sub-pan, and in the unlocked state, the spring expands and the engagement end releases from engagement with the engagement member.

19. A method to secure a peripheral component interconnect (PCI) riser cage, the method comprising:

providing the fastener to attach the PCI riser cage, the fastener including fastener including:

a body with an engagement end and a cap end, the engagement end to engage with a receptacle on a sub-pan, the cap end to position the body;

a rotation limiter including a receiving member with a double D shape to couple with a portion of the body and to move with the body as a unitary member, and a positioning member extending from the rotation limiter to limit rotation of the body coupled thereto; and a housing to receive the rotation limiter and the body, the housing includes a rotation aperture and a lateral aperture, the rotation aperture extending longitudinally therein to receive the positioning member such that the rotation limiter is rotatable along the rotation aperture, the lateral aperture extending laterally therethrough to receive the body such that the body is inserted through the lateral aperture and coupled to the receiving member of the rotation limiter;

inserting the fastener into the PCI riser cage and through a system board; and rotating the fastener to engage the fastener with a receptacle on a sub-pan and secure the PCI riser cage thereon.

20. The method of claim 19, wherein rotating the fastener further comprises limiting rotation of the fastener degrees to engage the engagement end with an engagement member on the receptacle.

* * * * *

UNITED STATES PATENT AND TRADEMARK OFFICE

CERTIFICATE OF CORRECTION

PATENT NO. : 9,098,252 B2
APPLICATION NO. : 13/529257
DATED : August 4, 2015
INVENTOR(S) : Keith A. Sauer et al.

It is certified that error appears in the above-identified patent and that said Letters Patent is hereby corrected as shown below:

In the Claims:

In column 8, line 56 approx., in Claim 19, delete "fastener including fastener including:" and insert -- fastener including: --, therefor.

In column 9, line 14, in Claim 20, delete "fastener degrees to" and insert -- fastener to --, therefor.

Signed and Sealed this
Twenty-third Day of August, 2016

Michelle K. Lee

Michelle K. Lee
*Director of the United States Patent and Trademark Office*